United States Patent [19]

Best et al.

[11] 3,883,816

[45] May 13, 1975

[54] DIFFERENTIAL AMPLIFIER

[75] Inventors: Donald T. Best, Lafayette Hill; John B. Schwarz, Abington, both of Pa.

[73] Assignee: Sperry Rand Corporation, Blue Bell, Pa.

[22] Filed: Mar. 11, 1974

[21] Appl. No.: 450,122

[52] U.S. Cl. ................ 330/30 R; 330/15; 330/30 D

[51] Int. Cl. .............................................. H03f 3/68

[58] Field of Search ............ 330/15, 30 D, 69, 118, 330/119, 122, 30 R

[56] References Cited

UNITED STATES PATENTS 3,538,447 11/1970 Johnson ......................... 330/119 X

FOREIGN PATENTS OR APPLICATIONS 773,984 5/1957 United Kingdom .................. 330/69

966,285 8/1964 United Kingdom .................. 330/15

*Primary Examiner*—James B. Mullins

*Attorney, Agent, or Firm*—C. C. English

[57] ABSTRACT

A transistorized differential amplifier which includes a pair of transistor elements and a pair of input terminals with a transformerless input coupling network for coupling each input terminal of the input terminal pair to both transistors. The input coupling network is configured to cause differential input signals to add across the base emitter junction of the transistor elements and common mode input signals to cancel across the base emitter junction of the transistors.

1 Claim, 2 Drawing Figures

DIFFERENTIAL AMPLIFIER

BACKGROUND

Figure 1:
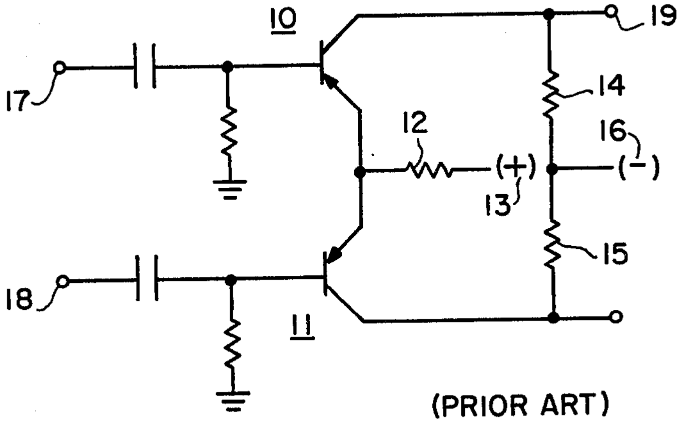
(PRIOR ART) FIG. 1

This invention relates to a differential amplifier circuit.

Differential amplifier circuits are well known in the art and have a wide variety of applications in the electronics field. These circuits are, for instance, extensively used where it is desired to amplify input signals applied across the input terminals (differential mode signals) and to simultaneously reject input signals applied equally to each input terminal with respect to ground or other reference mode (common mode signals). The ratio of amplification provided to the differential signals versus the amplification provided to the common mode signals is called the common mode rejection ratio. The higher this ratio the higher the figure of merit of the circuit.

SUMMARY OF THE INVENTION

It is an object of this invention to provide a simple differential amplifier circuit having a high common mode rejection ratio. In carrying out this objective and the other objectives of the invention the applicants' novel circuit comprises a pair of essentially matched transistor elements having base, collector and emitter electrodes. The emitter electrodes of each of the transistors are connected to a source of operating potential through separate but similar impedances as are the output or collector electrodes. A separate input terminal is connected to the base electrode of each of the respective transistor elements and to the emitter electrode of the opposite transistor element. The latter connection is made through an impedance transforming emitter follower circuit. The input interconnection is made so that differential input signals applied across the input terminals are reinforced across the base-emitter junction of each transistor element while common mode signals cancel across the base-emitter junction of the transistor elements. As a result of this interconnection an unusually high common mode rejection ratio becomes possible with less criticality in the matching of transistor elements.

Figure 2:
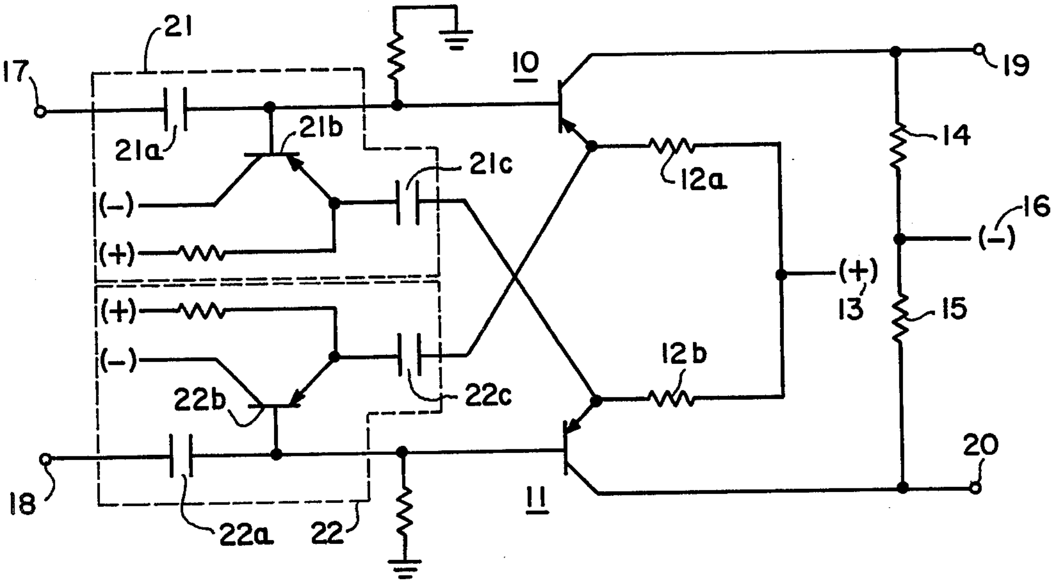

IN THE DRAWINGS:

FIG. 1 is a schematic diagram of a typical prior art differential amplifier, and FIG. 2 is a schematic diagram of a preferred embodiment of the invention.

DESCRIPTION

FIG. 1, to which reference is now made, shows a typical transformerless differrential amplifier which in the illustration comprises a pair of PNP transistor elements 10 and 11 with their emitters connected in common. In this circuit, the emitter electrodes are connected together through a common degenerative resistor 12 to a source 13 of operating potential while the collectors are connected through separate output impedances 14 and 15 to a source of collector potential 16. The base electrode of each of the transistors is R-C connected to a respective input terminal 17 and 18 while the output 19–20 is taken from across the collector electrodes.

This amplifier achieves its rather high common mode rejection ratio by means of the degenerative effect of the common emitter resistance 12. In operation, when signals of like senses (common mode signals) are simultaneously applied to the input terminals 17 and 18 the degenerative resistor 12 will cause a signal to be developed at the emitters which is in phase with the base signals so that only a small gain is experienced at the output terminals 19—20. Theoretically, if the transistors 10 and 11 and the collector resistors 14 and 15 are prefectly matched the gain for the common mode signal is proportional to the ratio of the collector resistor (14 or 15) to the emitter resistor (12). Conversely, when signals of opposite senses (push-pull signals) are applied to the input terminals 17 and 18 one transistor will conduct more current and the other will conduct less current so that the net current flowing through the common emitter resistance 12 remains substantially constant and the degenerative effects of resistance 12 is not felt by the circuit. In this case the input signals are substantially fully amplified at the output 19–20; the amount of amplification being proportional to the ratio of the collector resistor (14 or 15) to the effective internal emitter resistance of the transistor. Thus, in this circuit if all of the components were identical, the common mode rejection ratio theoretically would be proportional to the ratio of resistor 12 to the effective internal emitter resistance. Rejection ratios of 100 to 1 are reasonable to obtain; a rejection ratio of 1000 to 1 is only achieved when great care is taken in matching the circuit components and high dissipation levels can be tolerated.

In the present invention, as shown in FIG. 2, the single degenerative emitter resistor 12 is replaced by a pair of emitter resistors 12*a* and 12*b* and the input terminals 17 and 18 are coupled via a pair of input coupling networks 21 and 22 to the base and emitter electrodes of each of the transistors. In more particular, input terminal 17 is coupled through a first capacitor 21*a* to the base of transistor 10 and also through an impedance transforming emitter follower 21*b* and a second capacitor 21*c* to the emitter of transistor 11. Similarly, input terminal 18 is coupled through a first capacitor 22*a* to the base of transistor 11 and also through an impedance transforming emitter follower 22*b* and a second capacitor 22*c* to the emitter of transistor 10. As thus connected, a common mode signal appearing across terminals 17 and 18 is coupled in phase across the base emitter junction of each of the transistor elements 10 and 11 while a differential signal appearing across terminals 17 and 18 is coupled in push-pull to the base emitter junctions of the transistors 10 and 11. Thus, for the common mode signal, neither transistor has a net base to emitter signal voltage and the circuit will provide no amplification therefor. Conversely, a symmetrical or push-pull signal applied to the input terminals 17 and 18 causes a large net voltage to exist between the base and emitter junctions of each of the transistors and hence a fully amplified signal will appear across the output terminals 19 and 20. In more particular a positive going signal, for example, applied to terminal 17 is coupled via capacitor 21*a* to the base of transistor 10 and at the same time through emitter follower 21*b* and capacitor 21*c* to the emitter of transistor 11. A simultaneous negative going signal applied to terminal 18 is coupled through capacitor 22*a* to the base of transistor 11 and at the same time through emitter follower 22*b* and capacitor 22*c* to the emitter of transistor 10. In the case of the assumed differential signal, the current through transistor 10 is reduced independently of the gain characteristics of transistor 11 and the current through transistor 11 is increased independently of the gain characteristics of transistor 10 and a fully amplified signal appears across the output terminals 19 and 20.

From the foregoing descriptions it will be seen that since the base to emitter signals applied to transistors 10 and 11 of our circuit are independent of each other, the need for precision balanced transistors 10 and 11 is reduced over that required by the conventional amplifier shown in FIG. 1. The emitter followers 21*b* and 21*c* provide a low output impedance drive for the input signal coupling to the emitter circuits of transistors 10 and 11 and assures that a common mode signal applied to terminals 17 and 18 is coupled with a minimum attenuation to the emitter circuits of transistors 10 and 11. Also by selecting the emitter resistors 12*a* and 12*b* carefully, the quiescent current through the transistors 10 and 11 can be made equal and the output across terminals 19 and 20 balanced without requiring a high degree of matching of transistors 10 and 11.

What is claimed is:

1. A differential amplifier comprising: a pair of transistor elements each having base, emitter, and collector electrodes, separate impedance means connecting the respective emitter electrodes to a source of operating potential, output signal means connecting the collector electrodes to a source of operating potential, a pair of input signal terminals, a first signal path coupling the first of said pair of input signal terminals to the base electrode of a first one of said pair of transistors, a second signal path coupling the second of said input signal terminals to the base electrode of the second of said pair of transistors, a first emitter follower transistor cross coupling the said first input signal terminal to the emitter of said second transistor of said pair of transistors, and a second emitter follower transistor cross coupling the second of said pair of input terminals to the emitter electrode of the first of said pair of transistors.

* * * * *